(12) United States Patent
Ogata

(10) Patent No.: US 11,024,591 B2
(45) Date of Patent: Jun. 1, 2021

(54) MOBILE OBJECT AND WIRELESS COMMUNICATION MODULE

(71) Applicant: KYOCERA CORPORATION, Kyoto (JP)

(72) Inventor: Takumi Ogata, Yamato (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/615,783

(22) PCT Filed: May 15, 2018

(86) PCT No.: PCT/JP2018/018816
§ 371 (c)(1),
(2) Date: Nov. 21, 2019

(87) PCT Pub. No.: WO2018/216557
PCT Pub. Date: Nov. 29, 2018

(65) Prior Publication Data
US 2020/0219829 A1   Jul. 9, 2020

(30) Foreign Application Priority Data
May 26, 2017 (JP) .............................. JP2017-105042

(51) Int. Cl.
*H01L 23/66* (2006.01)
*H01L 23/552* (2006.01)
(Continued)

(52) U.S. Cl.
CPC .......... *H01L 23/66* (2013.01); *H01L 23/5383* (2013.01); *H01L 23/552* (2013.01); *H04B 1/40* (2013.01); *H01L 2223/6644* (2013.01)

(58) Field of Classification Search
CPC ... H01L 23/66; H01L 23/552; H01L 23/5383; H04B 1/40
(Continued)

(56) References Cited

U.S. PATENT DOCUMENTS

2012/0000699 A1*  1/2012  Inoue .................. H01L 23/3121
174/257
2012/0320559 A1*  12/2012  Kimura ................. H01L 23/552
361/818
(Continued)

FOREIGN PATENT DOCUMENTS

JP      2003100989 A     4/2003
JP      2010165728 A  *  7/2010
(Continued)

*Primary Examiner* — David Vu
*Assistant Examiner* — Brandon C Fox
(74) *Attorney, Agent, or Firm* — Duane Morris LLP

(57) ABSTRACT

A wireless communication module with improved performance and a mobile object that is equipped with the wireless communication module with the improved performance are provided. The mobile object is equipped with a wireless communication module. The wireless communication module includes a substrate, a first element, and a second element. The substrate includes ground layers. The first element is arranged on the substrate and amplifies an input RF signal. The second element is arranged on the substrate and different from the first element. Each of the ground layers has a groove formed between the first element and the second element.

6 Claims, 3 Drawing Sheets

(51) Int. Cl.
*H01L 23/538* (2006.01)
*H04B 1/40* (2015.01)

(58) Field of Classification Search
USPC .......................................... 257/659; 361/748
See application file for complete search history.

(56) References Cited

U.S. PATENT DOCUMENTS

2015/0119102 A1* 4/2015 Saji .................... H05K 9/0045
 455/550.1
2020/0203287 A1* 6/2020 Krefft ............... H01L 23/49822

FOREIGN PATENT DOCUMENTS

JP 2010165728 A 7/2010
JP 2015140054 A 8/2015

* cited by examiner

MOBILE OBJECT AND WIRELESS COMMUNICATION MODULE

CROSS-REFERENCE TO RELATED APPLICATION

This application claims priority to and the benefit of Japanese Patent Application No. 2017-105042 filed on May 26, 2017, the entire contents of which are incorporated herein by reference.

TECHNICAL FIELD

The present disclosure relates to a mobile object and a wireless communication module.

BACKGROUND

Conventionally, in-vehicle display apparatuses that can be mounted in various vehicles and include a circuit board configured to perform wireless communication are known (see PTL 1).

SUMMARY

A mobile object according to an embodiment of the present disclosure includes a wireless communication module. The wireless communication module includes a substrate that includes one or more ground layers, a first element that is arranged on the substrate and configured to amplify an input RF signal, and a second element that is arranged on the substrate and is different from the first element. The one or more ground layers include a groove formed between the first element and the second element.

A wireless communication module according to an embodiment of the present disclosure includes a substrate that includes one or more ground layers, a first element that is arranged on the substrate and configured to amplify an input RF signal, and a second element that is arranged on the substrate and is different from the first element. The one or more ground layers include a groove formed between the first element and the second element.

DETAILED DESCRIPTION

Figure 1:
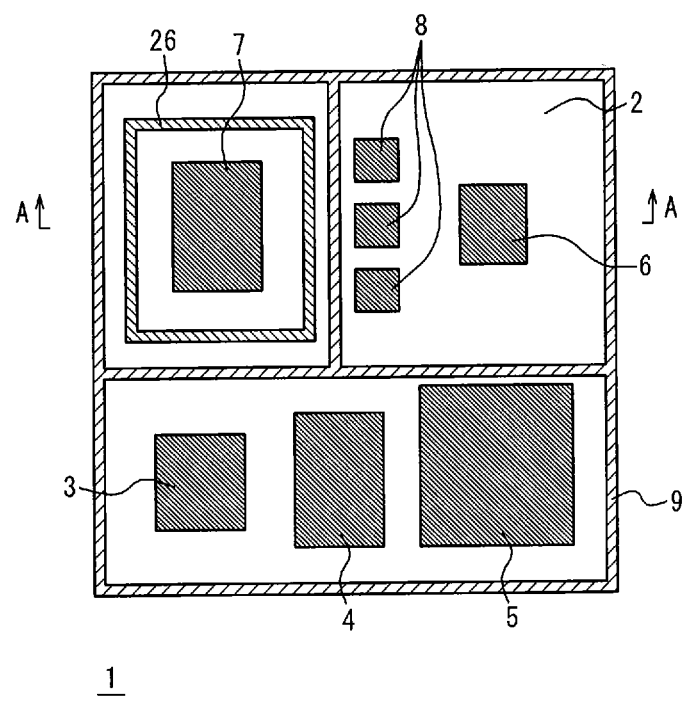
FIG. 1 is a plan view of a wireless communication module according to an embodiment of the present disclosure.

Conventionally, improvements in the performance of wireless communication modules are desired. The present disclosure aims to provide a wireless communication module with improved performance, and a mobile object equipped with the wireless communication module with the improved performance. According to an embodiment of the present disclosure, the performance of a wireless communication module is improved. Hereinafter, embodiments of the present disclosure will be described with reference to the accompanying drawings.

A wireless communication module 1 according to an embodiment of the present disclosure will be described with reference to FIG. 1. The wireless communication module 1 is used to perform wireless communication. The wireless communication module 1 may be provided to any apparatus that performs wireless communication. For example, the wireless communication module 1 may be provided to a mobile object.

The term "mobile object" used herein may encompass, for example, vehicles, ships, and aircraft. Vehicles may include automobiles and industrial vehicles. Vehicles are not limited thereto but may include rail vehicles, domestic vehicles, and fixed-wing aircraft that travel on a runway. Automobiles may include, for example, cars, trucks, buses, motorcycles, and trolley buses. Automobiles are not limited thereto but may include other automobiles that travel on the road. Industrial vehicles may include, for example, agricultural vehicles and construction vehicles. Industrial vehicles may include, for example, forklifts and golf carts. Industrial vehicles for agricultural purpose may include, for example, tractors, tillers, transplanters, binders, combined harvesters, and lawn mowers. Industrial vehicles for construction purposes may include, for example, bulldozers, scrapers, excavators, crane trucks, dump trucks, and load rollers. The vehicles may include human-power vehicles traveling on human power. Classification of the vehicles is not limited to the above. For example, vehicles may include industrial vehicles authorized to travel on the road, and a plurality of categories may include the same type of vehicle. Ships may include, for example, watercrafts, boats, and tankers. Aircraft may include, for example, fixed wing aircraft and rotorcraft.

The wireless communication module 1 includes any appropriate components used for wireless communication. For example, the wireless communication module 1 includes a substrate 2, a power source IC 3, a memory 4, a baseband IC (Integrated Circuit) 5, an RF (Radio Frequency) IC 6, a power amplifier 7, a filter 8, and a shield 9. The wireless communication module 1 may include any number of each of the power source IC 3, the memory 4, the baseband IC 5, the RFIC 6, the power amplifier 7, the filter 8, and the shield 9. Hereinafter, the power amplifier 7 will also be referred to as a first element. The filter 8 will also be referred to as a second element.

Figure 2:
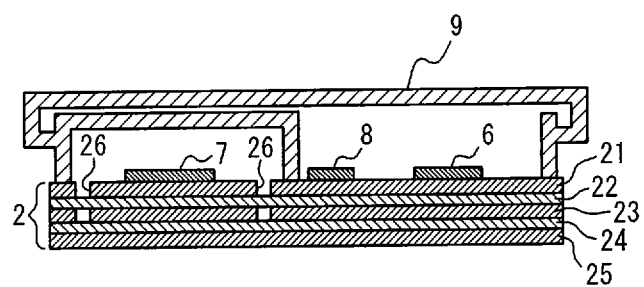
FIG. 2 is a cross-sectional view taken from line A-A of FIG. 1.

The substrate 2 is a layered substrate comprising a plurality of layers. The substrate 2 includes, for example, one or more ground layers and one or more insulating layers. However, this is not restrictive. For example, in FIG. 2 the substrate 2 is illustrated as including three ground layers 21, 23, and 25 and two insulating layers 22 and 24. For example, the ground layer and the insulating layer may be alternately arranged. Hereinafter, a layer positioned between two other layers will also be referred to as an inner layer. A layer which is not located between two other layers will also be referred to as a surface layer. For example, the ground layer 21 is a surface layer, and the ground layer 23 is an inner layer. The one or more ground layers that include the ground layer 21 serving as the surface layer has a groove 26. The number of the ground layers having the groove 26 may be appropriately determined. The groove 26 will be described in detail below.

The power source IC 3 illustrated in FIG. 1 supplies electrical power to each constituent element of the wireless communication module 1.

The memory 4 stores information and programs used for operation of the wireless communication module 1. The memory 4 may include, for example, a semiconductor memory, a magnetic memory, or an optical memory. The semiconductor memory may include a volatile memory or a nonvolatile memory.

The baseband IC 5 processes a baseband signal. For example, the baseband IC 5 inputs a baseband signal to the RFIC 6. The baseband IC 5 acquires a baseband signal from the RFIC 6.

The RFIC 6 processes an RF signal. For example, the RFIC 6 generates an RF signal by modulating a baseband signal input from the baseband IC 5. The RFIC 6 inputs the generated RF signal to the power amplifier 7. The RFIC 6 acquires, for example, an RF signal input from any appropriate antenna element.

The power amplifier 7 amplifies the RF signal input from the RFIC 6. The power amplifier 7 inputs the amplified RF signal to the filter 8.

The filter 8 attenuates a harmonic component of the RF signal amplified by the power amplifier 7. The RF signal having passed through the filter 8 is input to any appropriate antenna element.

The shield 9 attenuates electromagnetic waves radiated from the wireless communication module 1. For example, electromagnetic waves radiated from the wireless communication module 1 may include unnecessary radiation radiated from the power amplifier 7. The shield 9 may be formed from any appropriate metallic material. The shield 9 will be described in detail below.

The power source IC 3, the memory 4, the baseband IC 5, the RFIC 6, the power amplifier 7, the filter 8, and the shield 9 described above are arranged on the ground layer 21 of the substrate 2.

The constituent elements of the wireless communication module 1 are not limited to those described above by way of example. For example, the wireless communication module 1 may further includes any appropriate antenna element.

The groove 26 will be described in detail. At least a portion of the groove 26 is located between the power amplifier 7 and the filter 8. According to the present embodiment, the groove 26 may surround the power amplifier 7. In each of the one or more ground layers having the groove 26, an inner portion surrounded by the groove 26 and an outer portion are electrically isolated. In the present embodiment, the power amplifier 7 is grounded to the inner portion of the one or more ground layers having the groove 26. On the other hand, the power source IC 3, the memory 4, the baseband IC 5, the RFIC 6, the filter 8, and the shield 9 are grounded to the outer portion of the one or more ground layers having the groove 26.

The shield 9 will be described in detail. The shield 9 is grounded to the outer portion of the one or more ground layers having the groove 26, as described above. At least a portion of the shield 9 is positioned between the power amplifier 7 and the filter 8. According to the present embodiment, the shield 9 may cover the power amplifier 7.

In the wireless communication module 1 of the present embodiment, one or more ground layers of the substrate 2 has the groove 26, as described above. Thus, the wireless communication module 1 with improved performance can be realized, as described below.

For example, if the harmonic component of the RF signal amplified by the power amplifier 7 propagates through the ground and penetrates another element, it may cause trouble such that the element stops its normal operation. For example, if the harmonic component of the RF signal propagates through the ground and penetrates the filter 8, it may cause trouble by hindering attenuation of the harmonic component of the RF signal by the filter 8.

As such, the groove 26 electrically separates the ground to which the power amplifier 7 is grounded and the ground to which the power source IC 3, the memory 4, the baseband IC 5, the RFIC 6, the filter 8, and the shield 9 are grounded from each other, in the present embodiment. Thus, the harmonic component of the RF signal amplified by the power amplifier 7 is unlikely to penetrate other elements through the ground. Thus, the likelihood that the trouble described above occurs is reduced. Accordingly, the wireless communication module 1 with improved performance can be realized.

In the wireless communication module 1 according to the present embodiment, the shield 9 is grounded to a ground separated from the power amplifier 7. Thus, the wireless communication module 1 with further improved performance can be realized, as described below.

For example, if unnecessary radiation such as a harmonic component of the RF signal amplified by the power amplifier 7 propagates through the air and penetrates another element, it may cause trouble such that the element stops its normal operation. To reduce penetration of unnecessary radiation, it may be conceived, for example, to cover the power amplifier 7 with a component such as a shielding cover. However, in cases in which the shield cover is grounded to the same ground to which the power amplifier 7 is grounded, the harmonic components of the RF signal amplified by the power amplifier 7 may propagate through the ground and then to the shielding cover. In this case, unnecessary radiation may be radiated from the shielding cover itself. Thus, unnecessary radiation is not necessarily sufficiently reduced.

According to the present embodiment, in contrast, the shield 9 is grounded to a ground which is separated from the power amplifier 7. This reduces the likelihood that the shield 9 itself radiates unnecessary radiation. Thus, the wireless communication module 1 with further improved performance can be realized.

Although the present disclosure has been described based on the figures and embodiments, it should be appreciated that those who are skilled in the art may easily perform variations or alteration based on the present disclosure. Accordingly, such variations and alterations are to be included in the scope of the present disclosure. For example, the functions included in each of the means or steps may be rearranged avoiding a logical inconsistency, such that a plurality of means or steps are combined or subdivided.

Figure 3:
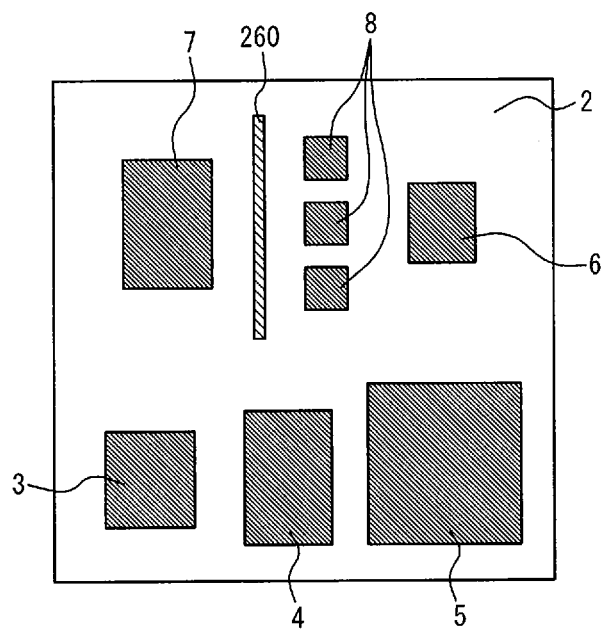
FIG. 3 is a plan view of a wireless communication module according to a first example variation of the embodiment of the present disclosure.

For example, in the embodiment described above, the configuration in which the groove 26 surrounds the power amplifier 7 has been described. However, a configuration in which the groove 26 does not surround the power amplifier 7 is also viable. For example, the wireless communication module 1 may have a configuration in which a groove 260 is provided between the power amplifier 7 and the filter 8 as illustrated in FIG. 3. This configuration also reduces the likelihood that the harmonic components of the RF signal amplified by the power amplifier 7 propagate through the ground and penetrate another element. Thus, the wireless communication module 1 with improved performance can be realized.

Figure 4:
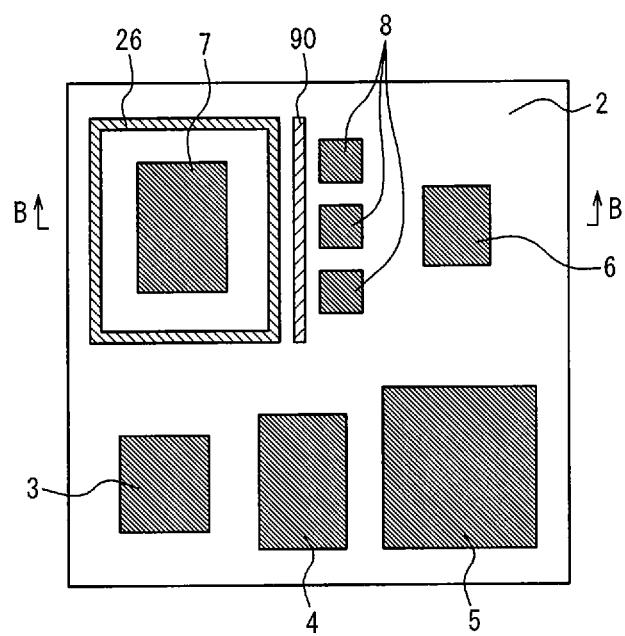
FIG. 4 is a plan view of a wireless communication module according to a second example variation of the embodiment of the present disclosure.
Figure 5:
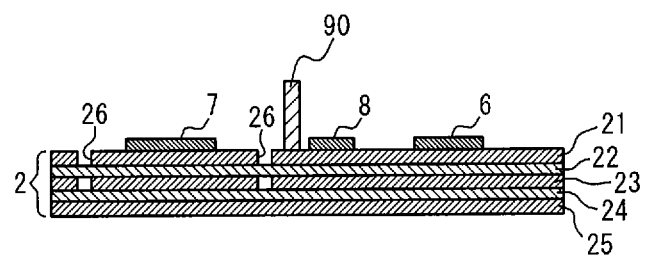
FIG. 5 is a cross-sectional view taken from line B-B of FIG. 4.

In the embodiment described above, the configuration in which the shield 9 surrounds the power amplifier 7 has been described. However, a configuration in which the shield 9 does not surround the power amplifier 7 is also viable. For example, the wireless communication module 1 may have a configuration in which a shield 90 is provided between the power amplifier 7 and the filter 8 as illustrated in FIG. 4 and FIG. 5. This configuration also reduces the likelihood that the harmonic components of the RF signal amplified by the power amplifier 7 propagate through the ground and penetrate another element. Thus, the wireless communication module 1 with improved performance can be realized.

Although in the above embodiments configurations in which the wireless communication module 1 is provided to a mobile object and serves as an apparatus for performing wireless communication has been described, this is not restrictive. The wireless communication module 1 may be provided to a communication apparatus such as, for example, a mobile phone, a smartphone, a tablet, an IoT (Internet of Things) device, or the like.

The groove 26 may be formed by cutting out a part of a wiring after laminating the ground layer, or may be a gap formed as a result of lamination (printing) of the ground layer having a wiring pattern in which a gap is formed in a part of the wiring. The groove 26 described above may also be referred to as a slit 26, as appropriate.

The invention claimed is:

1. A mobile object comprising:
 a wireless communication module that includes:
  a substrate that includes one or more ground layers;
  a first element that is arranged on the substrate and configured to amplify an input RF signal; and
  a second element that is arranged on the substrate and is different from the first element,
  wherein the one or more ground layers include a groove formed between the first element and the second element,
  the groove surrounds the first element, and
  in each of the one or more ground layers, an inner portion surrounded by the groove and an outer portion are electrically separated.

2. A wireless communication module comprising:
 a substrate that includes one or more ground layers;
 a first element that is arranged on the substrate and configured to amplify an input RF signal; and
 a second element that is arranged on the substrate and is different from the first element,
 wherein the one or more ground layers include a groove formed between the first element and the second element,
 the groove surrounds the first element, and
 in each of the one or more ground layers, an inner portion surrounded by the groove and an outer portion are electrically separated.

3. The wireless communication module according to claim 2,
 wherein the one or more ground layers include a first ground layer serving as a surface layer on which the first element is arranged, and a second ground layer serving as an inner layer.

4. The wireless communication module according to claim 2,
 wherein the first element is connected to the inner portion of the one or more ground layers, and
 the second element is connected to the outer portion of the one or more ground layers.

5. The wireless communication module according to claim 2, further comprising a shield that is connected to the outer portion of the one or more ground layers.

6. The wireless communication module according to claim 5,
 wherein the first element is covered by the shield.

* * * * *